(12) United States Patent
Mauder et al.

(10) Patent No.: US 8,445,993 B2
(45) Date of Patent: May 21, 2013

(54) SEMICONDUCTOR COMPONENT WITH MARGINAL REGION

(75) Inventors: Anton Mauder, Kolbermoor (DE); Hans-Joachim Schulze, Taufkirchen (DE); Hans-Joerg Timme, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/332,628

(22) Filed: Dec. 21, 2011

(65) Prior Publication Data

US 2012/0091564 A1    Apr. 19, 2012

Related U.S. Application Data

(62) Division of application No. 12/543,995, filed on Aug. 19, 2009, now Pat. No. 8,102,028.

(30) Foreign Application Priority Data

Aug. 19, 2008  (DE) .................. 10 2008 038 342

(51) Int. Cl.
*H01L 27/00*   (2006.01)
(52) U.S. Cl.
USPC ............ 257/620; 257/E23.179; 257/E21.214; 438/462

(58) Field of Classification Search
USPC .......... 257/620, E23.179, E21.214; 438/462
See application file for complete search history.

(56) References Cited

U.S. PATENT DOCUMENTS

| | | | |
|---|---|---|---|
| 4,096,619 A | 6/1978 | Cook | |
| 6,143,629 A * | 11/2000 | Sato | 438/455 |
| 6,975,017 B2 | 12/2005 | Towle et al. | |
| 7,256,474 B2 | 8/2007 | Wakayama et al. | |
| 7,459,377 B2 | 12/2008 | Ueda et al. | |
| 8,076,756 B2 * | 12/2011 | Lane et al. | 257/620 |
| 2010/0252916 A1 | 10/2010 | Chen et al. | |
| 2010/0283128 A1 | 11/2010 | Chen | |
| 2011/0140245 A1 * | 6/2011 | Lane et al. | 257/620 |
| 2011/0318926 A1 * | 12/2011 | Ito et al. | 438/689 |

OTHER PUBLICATIONS

Non-Final Office Action mailed Jul. 1, 2011 in U.S. Appl. No. 12/543,995.

* cited by examiner

*Primary Examiner* — Allan R Wilson
(74) *Attorney, Agent, or Firm* — Dicke, Billig & Czaja, PLLC

(57) ABSTRACT

A semiconductor wafer is disclosed. One embodiment provides at least two semiconductor components each having an active region, and wherein at least one zone composed of porous material is arranged between the active regions of the semiconductor components.

15 Claims, 7 Drawing Sheets

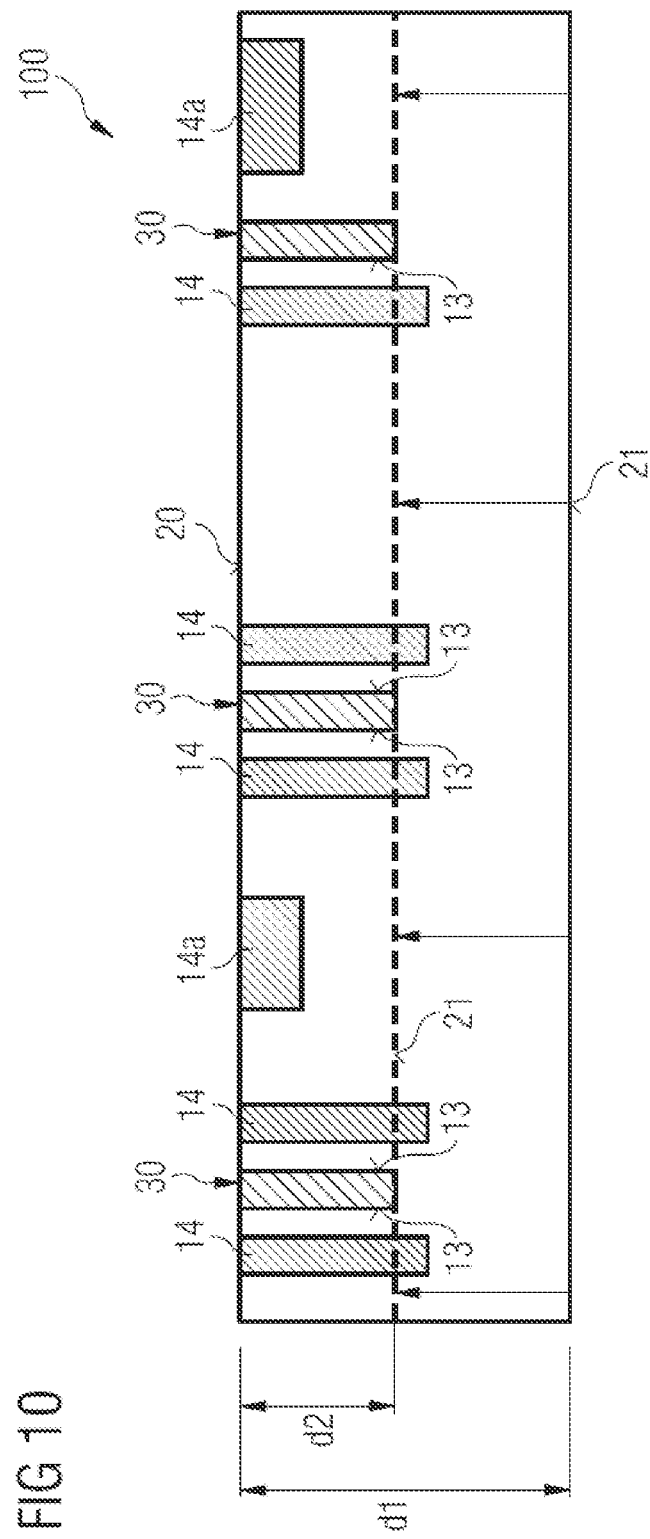

SEMICONDUCTOR COMPONENT WITH MARGINAL REGION

CROSS-REFERENCE TO RELATED APPLICATIONS

This Utility Patent Application is a divisional application of U.S. application Ser. No. 12/543,995, filed Aug. 19, 2009, and claims priority to German Patent Application No. DE 10 2008 038 342.2 filed on Aug. 19, 2008, which are both incorporated herein by reference.

BACKGROUND

The invention relates to a semiconductor component having a marginal region, to a semiconductor wafer having a zone composed of porous material, and to a method for singulating semiconductor components from a semiconductor wafer.

In the production of semiconductor components, during the singulation of the chips, for example by sawing or laser treatment from a semiconductor wafer, cracks can arise in the silicon which advance right into the active region of the semiconductor components. Moreover, during subsequent processing of the semiconductor components, such as during soldering for example, heavy metals, such as copper for example, can indiffuse into the electrically active region of the semiconductor components via the sawing edge. This leads in each case to an impairment of the electrical properties of the semiconductor component.

The effects of crack production mentioned during singulation can at present only be reduced by using a sufficient safety distance between the separating edge and the electrically active region of the semiconductor component. However, the area utilization of a semiconductor wafer is significantly reduced and the indiffusion of contaminating elements cannot be significantly prevented.

For these and other reasons, there is a need for the present invention.

BRIEF DESCRIPTION OF THE DRAWINGS

FIG. 10 illustrates a schematic cross-sectional view of an exemplary embodiment of a semiconductor wafer with additional zones composed of porous material.

DETAILED DESCRIPTION

Figure 1:
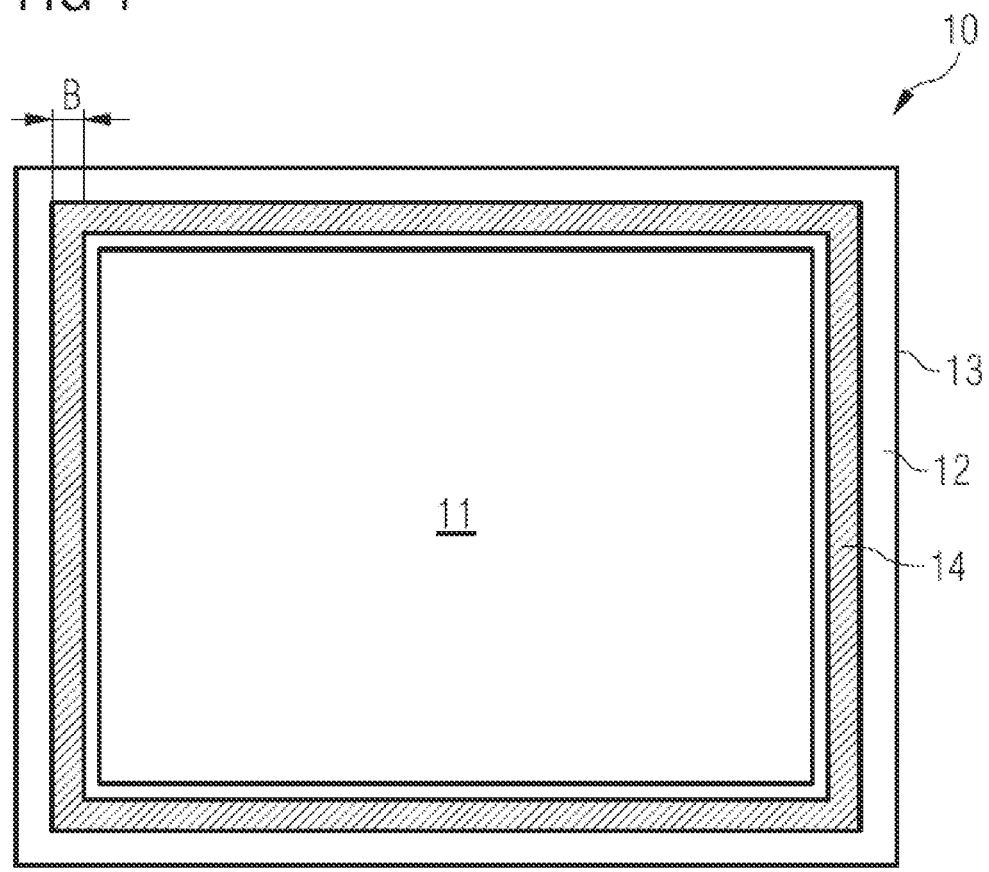
FIG. 1 illustrates a schematic plan view of an exemplary embodiment of a semiconductor component with a zone composed of porous material in the marginal region.

Embodiment are explained in more detail below, with reference to the accompanying figures. However, the invention is not restricted to the embodiments specifically described, but rather can be modified and altered in a suitable manner. It lies within the scope of the invention to suitably combine individual features and feature combinations of one embodiment with features and feature combinations of another embodiment in order to arrive at further embodiments according to the invention.

One or more embodiments provide a semiconductor component having reduced adverse influences in the electrically active region, a semiconductor wafer for obtaining semiconductor components having reduced adverse influences in the electrically active region, and a method for producing such semiconductor components.

The invention is characterized by the independent claims. Developments of the invention are found in the dependent claims.

One embodiment relates to a semiconductor component including a semiconductor body having an active region and a marginal region surrounding the active region, wherein the marginal region extends from the active region as far as an edge of the semiconductor body and wherein a zone composed of porous material is formed in the marginal region. A further embodiment relates to a semiconductor wafer including at least two semiconductor components each having an active region, wherein at least one zone composed of porous material is arranged between the active regions of the semiconductor components.

A further embodiment relates to a method for producing a semiconductor component, which involves providing a semiconductor wafer including at least two semiconductor components each having an active region. At least one zone is composed of porous material is arranged between the active regions of the semiconductor components. The semiconductor wafer is separated between the active regions in order to produce individual semiconductor bodies. The separation is effected in a separating zone along the zone composed of porous material in such a way that each individual semiconductor body has an active region and a marginal region surrounding the active region. The marginal region extends from the active region as far as an edge of the semiconductor body and wherein at least one part of the zone composed of porous material remains in the marginal region.

One common element to these embodiments is that the zone composed of porous material prevents the penetration of crystal defects from the marginal region, such as, for example, slip lines or dislocations caused during the singulation of the semiconductor components, or else the penetration of heavy metals into the electrically active region of the semiconductor components. Consequently, the adverse influencing of the electrical properties of the semiconductor component associated with such penetration of crystal defects or heavy metals into the electrically active region is at least largely avoided. The penetration of rapidly diffusing heavy metals into the electrically active region is prevented in one embodiment by a gittering of the heavy metals at the semiconductor surfaces amply present in the porous layer.

Before the exemplary embodiments are explained in more detail below with reference to the figures, it is pointed out that identical elements in the figures are provided with the same or similar reference symbols, and that a repeated description of the elements is omitted. Furthermore, the figures are not necessarily true to scale; rather, the main emphasis is on elucidating the basic principle.

FIG. 1 illustrates a schematic time view of a semiconductor body 10 of a semiconductor component. The semiconductor body 10 can be formed from any monocrystalline semiconductor material. In one embodiment, monocrystalline silicon is suitable for this purpose. An active region 11 is arranged in a region of the semiconductor body 10 that is arranged centrally in the plan view. An active region should be understood to mean that region of the semiconductor body 10 which carries current in the operating state of a semiconductor component, or the semiconductor region in which a space charge zone is established in the off state. The active semiconductor component structures of the semiconductor body 10 are generally formed in the active region 11. Such active semiconductor component structures include one or more junctions between differently doped semiconductor regions, such as, for example, pn junctions or regions having different dopant concentrations. By applying an external voltage to the active semiconductor structures with the aid of at least two electrodes fitted to the semiconductor body 10, a current flows within the semiconductor component structures, which current can be regulated by control devices, such as, for example, a gate electrode in the case of MOSFETs. The edge terminations of the pn junctions—such as e.g. field rings and/or field plates—also belong to the active region.

The active region 11 is surrounded by a marginal region 12, which has no space charge zone in the blocking state. The marginal region 12 is likewise part of the semiconductor body 10 and extends from the active region 11 as far as an edge 13 of the semiconductor body 10.

A zone 14 composed of porous material is formed in the marginal region 12. In the embodiment illustrated in FIG. 1, the zone 14 composed of porous material is arranged exclusively in the marginal region 12 and spaced apart both from the active region 11 and from the edge 13. However, the zone 14 composed of porous material can also extend completely over the entire width of the marginal region 12 and possibly even partly project into the active region 11. Moreover, the zone 14 can also extend in a manner spaced apart from the active region 11 as far as the edge 13 of the semiconductor body 10 or from the active region 11 as far as a specific distance from the edge 13. In this case, the zone 14 composed of porous material has for example a width B in the range of between 0.5 μm and 40 μm. The material of the porous zone 14 can be any desired material that prevents penetration of crystal defects and heavy metals into the electrically active region of the semiconductor component. By way of example, the material of the porous zone 14 can also be a semiconductor material, in one embodiment the same semiconductor material as the semiconductor body 10, such as silicon, for example. The porosity e of the porous material of the zone 14 should lie between 30% and 90%, in one embodiment between 50% and 85%. The porosity $\epsilon$ is in this case defined as the ratio of cavity volume $V_H$ to the total volume V: $\epsilon = V_H/V$.

Figure 2:
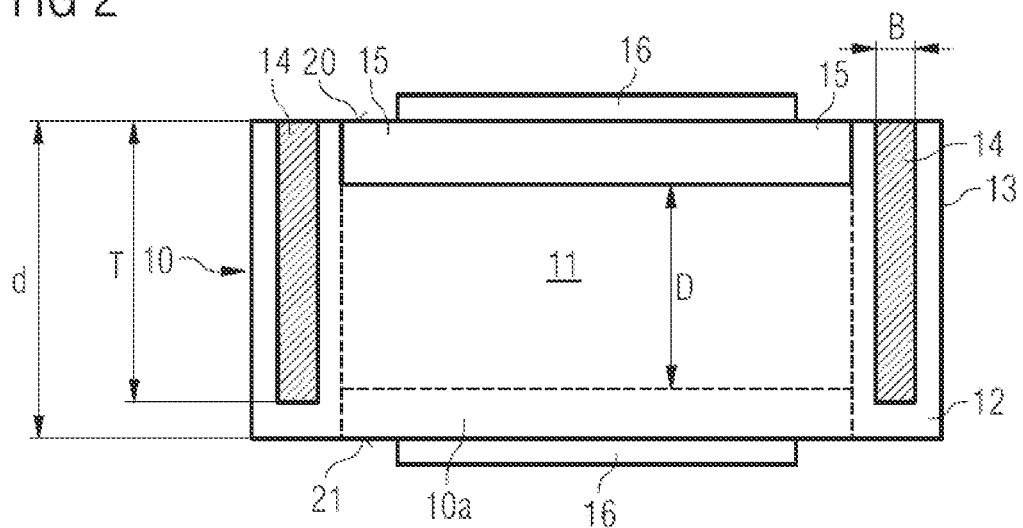
FIG. 2 illustrates a schematic cross-sectional view of an exemplary embodiment of a semiconductor component with a zone composed of porous material in the marginal region.

FIG. 2 illustrates a schematic cross-sectional view of an exemplary embodiment of the semiconductor body 10 that is similar to the exemplary embodiment in FIG. 1. The semiconductor body 10 once again has an active region 11, in which semiconductor component structures 15 are formed, and a marginal region 12, in which a zone 14 composed of porous material is formed. The semiconductor component structures 15 are formed in the semiconductor body 10 at a first surface 20 of the semiconductor body 10. Moreover, a drift path D extends in the semiconductor body 10 from the semiconductor component structures 15 in the direction of a second surface 21 of the semiconductor body 10. In this embodiment, a drift path is that part of the semiconductor body, for example of a power semiconductor component, which takes up a space charge zone when a reverse voltage is applied to the semiconductor component, proceeding from a pn junction. The drift path D is generally a lightly doped semiconductor region having a dopant concentration in the range of from a few $10^{13}$ up to a few $10^{15} cm^{-3}$. The semiconductor body 10 has a thickness d. A part of the active region 11 between the drift path D and the second surface 21 can be used as a connection region 10a for the semiconductor component. The connection zone is highly doped in this embodiment, that is to say that it has a dopant concentration of from a few $10^{17} cm^{-3}$ up to a few $10^{19} cm^{-3}$.

The zone 14 composed of porous material in the marginal region 12 extends from the first surface 20 of the semiconductor body 10 right into a depth T into the semiconductor body 10 measured from the first surface. The depth T is dimensioned on the basis of the depth of the electrically active region of the semiconductor body 10, that is to say the depth of the maximum space charge zone occurring in the operating case of the semiconductor component into the drift path D in the active region 11 of the semiconductor body 10. In one embodiment, the depth T should be greater than the depth of the electrically active region in the active region 11, that is to say for example deeper than the drift path D, in order to prevent the penetration of crystal defects and heavy metals from the edge 13 into the electrically active region. In this embodiment, the depth T lies for example in the range of between 2 μm and 250 μm. The depth T can also correspond to the thickness d of the semiconductor body 10. This is tantamount to the zone 14 extending completely through the semiconductor body 10.

The semiconductor component structures 15 in the active region 11 of the semiconductor component, and also the entire active region 11 are electrically connected to at least two electrodes 16 fitted to the semiconductor body 10.

Figure 3:
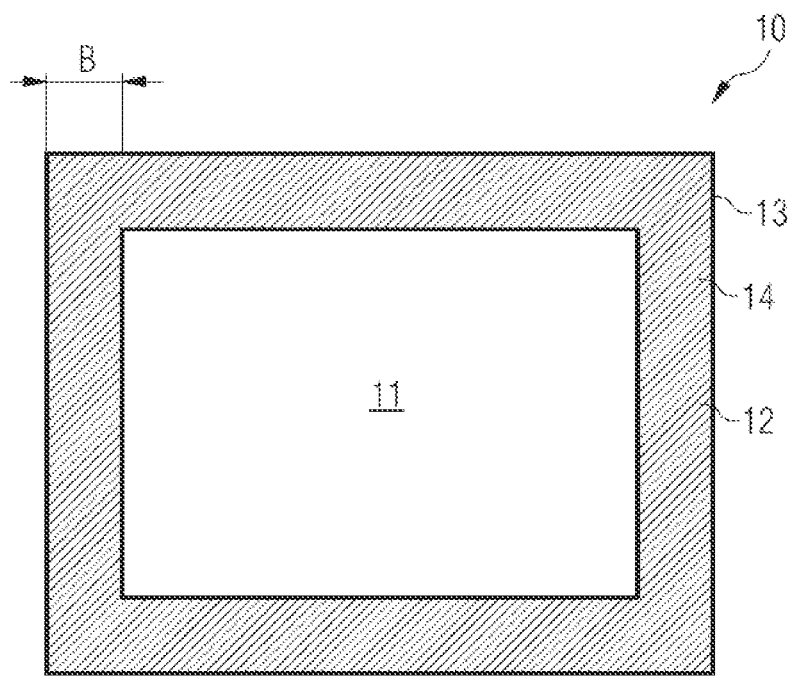
FIG. 3 illustrates a schematic plan view of a further exemplary embodiment of a semiconductor component with a zone composed of porous material in the marginal region.

FIG. 3 illustrates a schematic plan view of an exemplary embodiment of the semiconductor body 10 wherein the zone 14 composed of porous material extends over the entire width of the marginal zone 12. The porous material thus forms the marginal region between the edge 13 and the active region 11 down into the depth T. Consequently selected diffusion substances which can be used for example for channel stoppers, isolation diffusions or vertical edge terminations can indiffuse into the active region 11 as required via the pores of the porous material. This is possible in one embodiment because the diffusion of selected dopants or diffusion substances can take place significantly faster in the porous material of the zone 14 than in the solid monocrystalline material of the semiconductor body 10.

Figure 4:
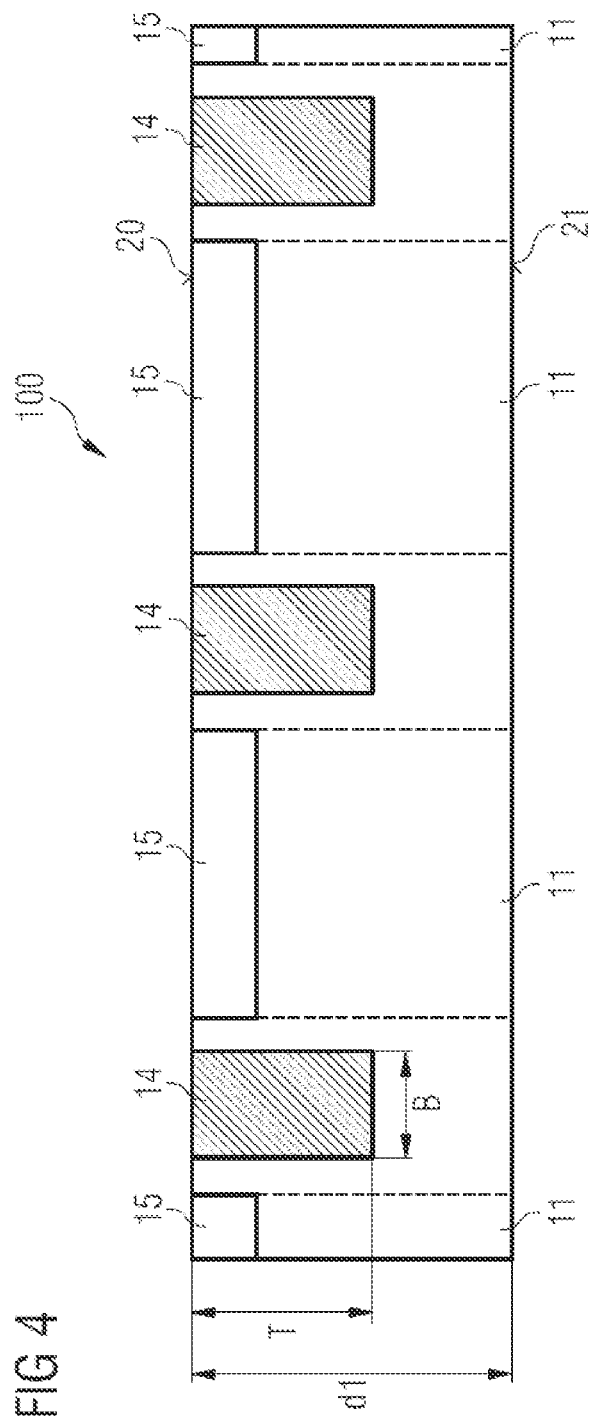
FIG. 4 illustrates a schematic cross-sectional view of an exemplary embodiment of a semiconductor wafer with zones composed of porous material between the active regions of semiconductor components.

FIG. 4 illustrates a schematic cross-sectional view of an excerpt of a semiconductor wafer 100. The semiconductor wafer 100 can be for example any customary wafer, which are currently obtainable with wafer diameters of up to 300 mm.

The semiconductor wafer 100 has at least two semiconductor components. Each of these semiconductor components formed in the semiconductor wafer 100 has an active region 11 having semiconductor component structures 15. At least one zone 14 composed of porous material is arranged between the active regions 11 of the semiconductor components in the semiconductor wafer 100. As already explained with regard to FIGS. 1 to 3, the zones 14 can be produced from any desired porous material that prevents propagation of crystal defects and heavy metal atoms. In general, the porous material of the zones 14 will be a semiconductor material, in one embodiment the same semiconductor material as that of the semiconductor wafer 100. The semiconductor wafer 100 has a thickness d1. The zones 14 composed of porous material have a width B in the direction from one active region 11 to the closest active region 11. In this embodiment, the width B lies in the range of 0.5 μm to 100 μm. Moreover, the zones 14 extend into the semiconductor wafer 100 from a first surface 20 of the semiconductor wafer 100 as far as a depth T in the direction toward the second surface 21 of the semiconductor wafer 100, the second surface lying opposite the first surface 20.

Figure 5:
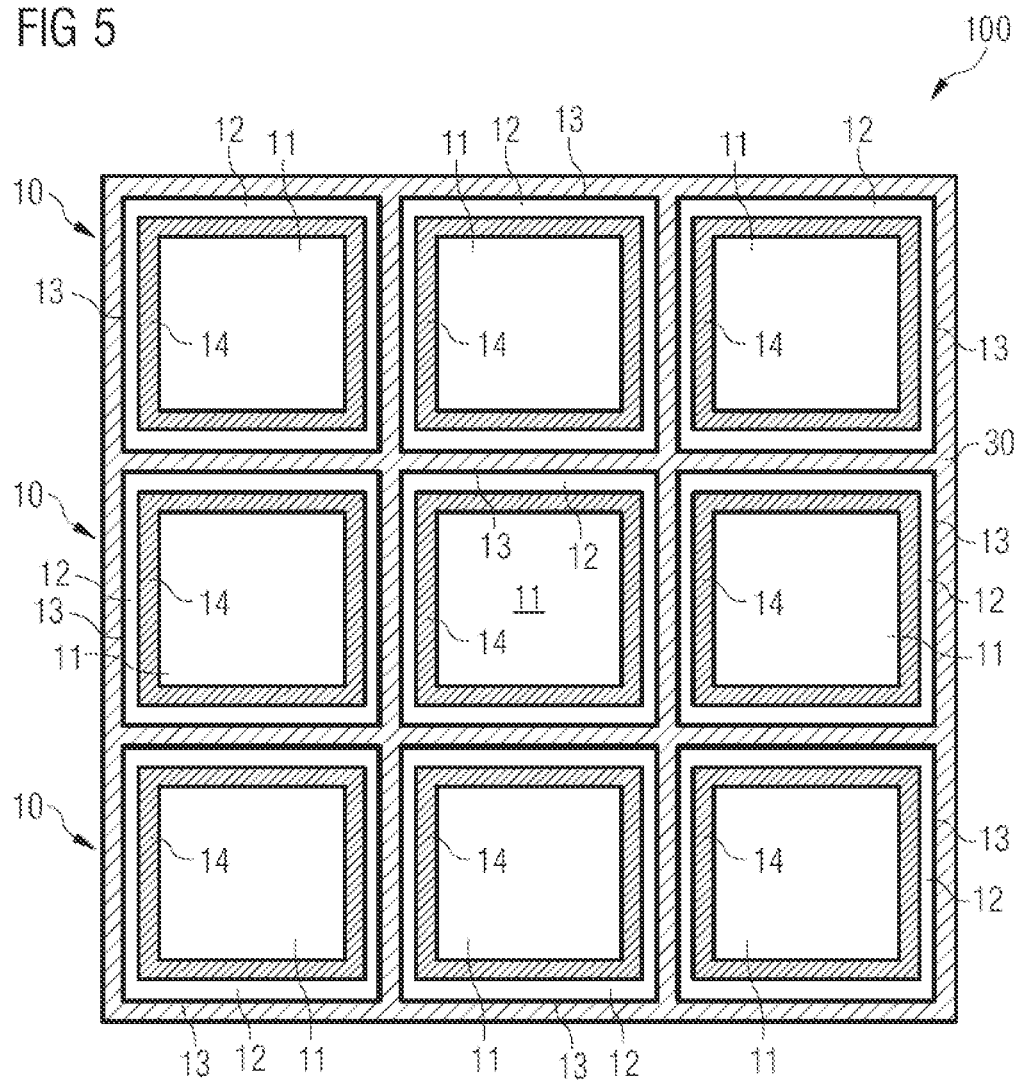
FIG. 5 illustrates a schematic plan view of an exemplary embodiment of a semiconductor wafer with zones composed of porous material between the active regions of semiconductor components and with separating zones between the semiconductor components.

FIG. 5 illustrates a schematic plan view of a semiconductor wafer 100. The semiconductor wafer 100 in turn has a multiplicity of semiconductor components, wherein each semiconductor component has an active region 11 and a zone 14 composed of porous material that surrounds the active region 11. In this embodiment, two zones 14 composed of porous material are arranged alongside one another between two closest active regions 11, the zones each having a width B. Between these two zones 14 lying alongside one another, provision is made of a separating zone 30 along the zones 14. The separating zone 30 is that region in which the semiconductor wafer 100 is separated for the singulation of the semiconductor components. Consequently, the margin of the separating zone 30 forms the later edge 13 of the semiconductor body 10 of a semiconductor component.

Figure 6:
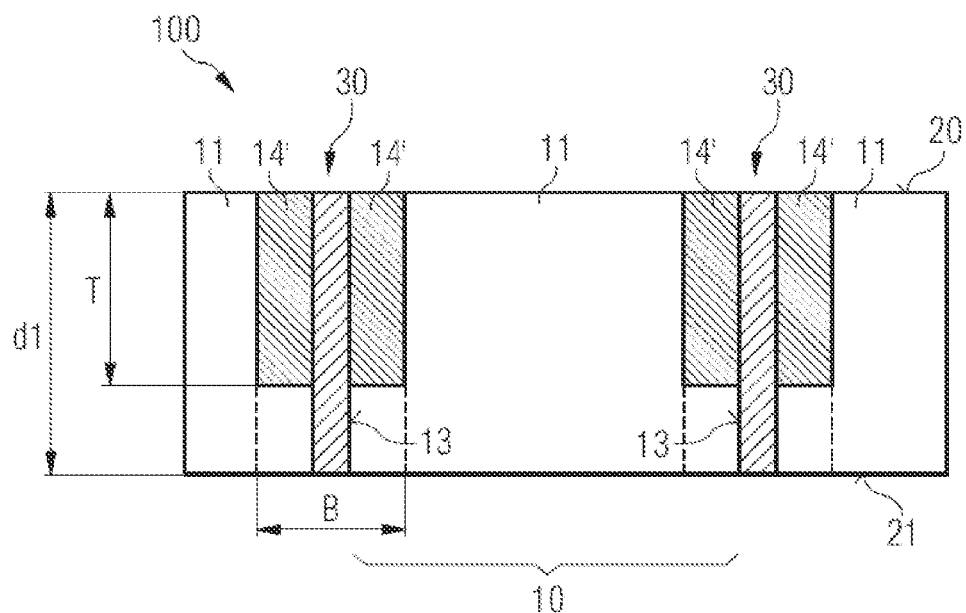
FIG. 6 illustrates a schematic cross-sectional view of an exemplary embodiment of a separating zone in a zone composed of porous material of a semiconductor wafer.

FIG. 6 illustrates a schematic cross-sectional view of an embodiment of a semiconductor wafer 100 when the separating zone 30 is arranged in the zone 14 composed of porous material. This is tantamount to a single zone 14 composed of porous material being produced between the individual active regions 11 formed in the semiconductor wafer 100. The zone 14 has a width B, however, which permits a separation of the semiconductor wafer 100 in the separating zone 30 and thus in the zone 14 and a sufficiently wide residual zone 14' composed of porous material nevertheless still remains at the edge 13 of the semiconductor body 10 of a semiconducting component produced in this way. In general, therefore, the width B of the zone 14 should in this case be greater than 20 μm. In the embodiment illustrated in FIG. 6, a semiconductor wafer 100 has a thickness d1. The zone 14 composed of porous material extends only into a depth T adapted to the electrically active region of the active region 11. As an alternative, however, the zone 14 can also extend over the entire thickness d1 of the semiconductor wafer 100.

Figure 7:
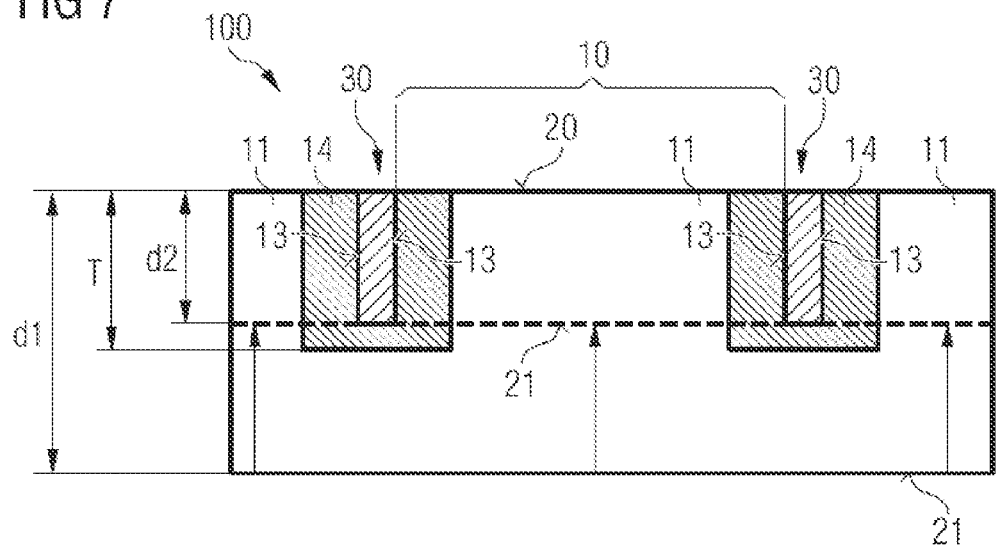
FIG. 7 illustrates a schematic cross-sectional view of an exemplary embodiment of a semiconductor wafer with a separating zone in a zone composed of porous material.

FIG. 7 illustrates a schematic cross-sectional view of a further embodiment of a semiconductor wafer 100 with zones 14 composed of porous material. The semiconductor wafer 100 has an original thickness d1. Zones 14 composed of porous material are formed down into a depth T in this semiconductor wafer 100. The zones 14 are situated between the active regions 11 of the semiconductor bodies 10 of semiconductor components that are arranged in the semiconductor wafer 100. After the zones 14 have been formed in the semiconductor wafer 100, the semiconductor wafer 100 is thinned from its original thickness d1 to a final thickness d2 at its second surface 21. In the example illustrated it holds true that the final thickness d2 is less than T. Consequently, the zone 14 composed of porous material extends over the entire final thickness d2 of the thinned semiconductor wafer 100. The separating zone 30 for separating the semiconductor wafer into individual semiconductor components runs in the zones 14 composed of porous material in the same way as already illustrated in FIG. 6. The zone 14 has to be formed with a width such that the width of the separating zone 30 is less than the width B of the zone 14. Consequently, a residue of the zone 14 composed of porous material remains between the edge 13 of the semiconductor body 10 produced by the separation of the semiconductor wafer 100 and the active region 11 and can thus achieve the desired effect that the penetration of crystal defects and penetration of heavy metals into the electrically active region of the semiconductor component are prevented.

Figure 8:
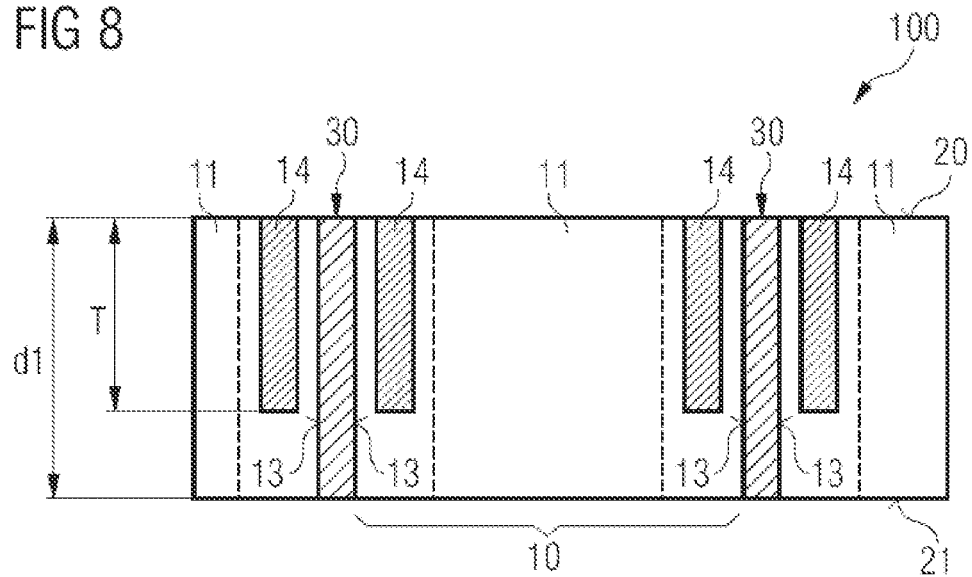
FIG. 8 illustrates a schematic cross-sectional view of an exemplary embodiment of a semiconductor wafer with a separating zone between two zones composed of porous material.

FIG. 8 illustrates an exemplary embodiment of a semiconductor wafer 100 wherein two laterally spaced-apart zones 14 composed of porous material are formed between two active regions 11 in the semiconductor wafer 100 and the separating zone 30 is provided between the two laterally spaced-apart zones 14. The separating zone 30 thus runs in the solid semiconductor material of the semiconductor wafer 100, as is already known in conventional methods for separating semiconductor wafers. Consequently, the singulation of the semiconductor components from the semiconductor wafer 100 can be carried out with known process parameters of, for example, sawing or laser methods. An adaptation to the mechanical properties of porous material such as is necessary for example in the case of the exemplary embodiment concerning FIG. 6 or FIG. 7 is not required. On the other hand, it is possible to set the separating speed through porous material generally to be higher than in solid material. Consequently, it would be possible to reduce the process time for the singulation of the semiconductor components in the cases in which the separating zone 30 leads through the zone 14 composed of porous material.

Figure 9:
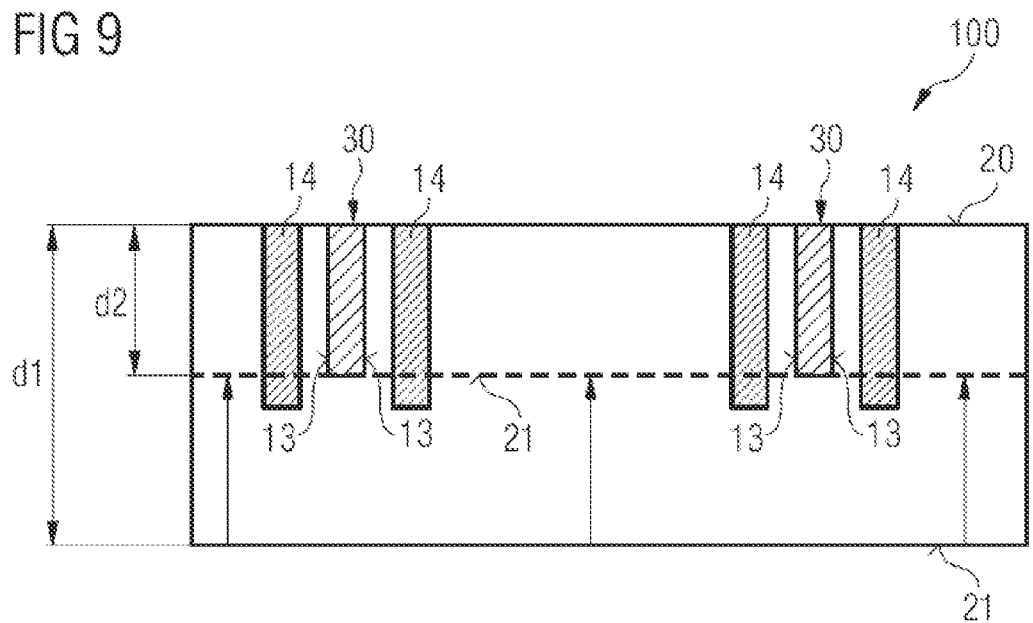
FIG. 9 illustrates a schematic cross-sectional view of an exemplary embodiment of a semiconductor wafer with a separating zone between two zones composed of porous material.

FIG. 9 illustrates a further exemplary embodiment of a semiconductor wafer 100 with zones 14 composed of porous material. Analogously to the exemplary embodiment concerning FIG. 8, in this case likewise two zones 14 are arranged between the active regions 11 in the semiconductor wafer 100 and the separating zone 30 runs between the two laterally spaced-apart zones 14 composed of porous material. In contrast to the exemplary embodiment in FIG. 8, the semiconductor wafer 100, as already explained in the exemplary embodiment concerning FIG. 7, is thinned from an original thickness d1 to a final thickness d2.

FIG. 10 illustrates, in a further embodiment of the semiconductor wafer 100, an arrangement of zones 14 composed of porous material and of the separating zones 30 similar to the embodiment explained for FIG. 9. In contrast to the exemplary embodiment in FIG. 9, additional zones 14a composed of porous material are formed in the semiconductor wafer 100. These additional zones 14a can be arranged in direct proximity to the zones 14. However, the zones 14a can partly overlap the zones 14 or be arranged in a manner laterally spaced apart from the zones 14. The additional zones 14a can reduce stresses which arise in the semiconductor wafer 100 for example during processing of the semiconductor wafer 100 and lead to warpages of the semiconductor wafer 100. The positioning of the additional zones 14a in the semiconductor layer 100 depends, for example, on where semiconductor regions are still unused. The zones 14a can be arranged on each individual semiconductor body 10 of a semiconductor component or alternatively in one embodiment completely irregularly in the semiconductor wafer 100.

Finally, it should again be pointed out that the exemplary embodiments illustrated are not intended to signify any restriction of the invention to the examples specifically illustrated. Thus, by way of example, the thinning of the semiconductor wafer 100 or of the semiconductor body 10 is dependent on the application sought for the semiconductor component and has no influence on the specific lateral arrangement of the zones 14 and the separating zones 30.

What is claimed is:

1. A semiconductor wafer comprising:
    at least two semiconductor components each having an active region, each active region having a surface parallel to the semiconductor wafer, and
    wherein at least one zone composed of porous material is arranged between the active regions of the semiconductor components, each zone having a surface parallel to the semiconductor wafer,
    wherein the surface of each active region is coplanar with the surface of each zone.

2. The semiconductor wafer of claim 1, wherein the zone composed of porous material extends from a first surface of the semiconductor wafer right into a depth T measured from the surface of the semiconductor wafer.

3. The semiconductor wafer of claim 2, wherein the depth T corresponds to the thickness d1 of the semiconductor wafer.

4. The semiconductor wafer of claim 1, wherein the width B of the at least one zone composed of porous material in the direction from one active region to the closest active region is between 0.5 µm and 100 µm.

5. The semiconductor wafer of claim 1, wherein two zones composed of porous material are arranged between two closest active regions.

6. A method for producing a semiconductor component, the method comprising:
    providing a semiconductor wafer as claimed in claim 1,
    separating the semiconductor wafer between the active regions in order to produce individual semiconductor bodies, wherein the separation is effected in a separating zone along the zone composed of porous material in such a way that each individual semiconductor body has an active region and a marginal region surrounding the active region, wherein the marginal region extends from the active region as far as an edge of the semiconductor body and wherein at least one part of the zone composed of porous material remains in the marginal region.

7. The method of claim 6, wherein the separating zone runs within the zone composed of porous material.

8. The method of claim 6, wherein the semiconductor wafer is separated between the two zones composed of porous material.

9. The method of claim 6, comprising thinning the semiconductor wafer from a original thickness d1 to a final thickness d2 prior to the separation.

10. A method for producing a semiconductor component, the method comprising:
    providing a semiconductor wafer comprising at least two semiconductor components each having an active region, wherein at least one zone composed of poron material is arranged between the active regions of the semiconductor components;
    separating the semiconductor wafer between the active regions in order to produce individual semiconductor bodies, wherein the separation is effected in a separating zone along the zone composed of porous material in such a way that each individual semiconductor body has an active region and a marginal region surrounding the active region, wherein the marginal region extends from the active region as far as an edge of the semiconductor body and wherein at least one part of the zone composed of porous material remains in the marginal region; and
    in diffusing a dopant into the active region through the porous material.

11. The method of claim 10, wherein the separating zone runs within the zone composed of porous material.

12. The method of claim 10, wherein the semiconductor wafer is separated between the two zones composed of porous material.

13. The method of claim 10, comprising thinning the semiconductor wafer from an original thickness d1 to a final thickness d2 prior to the separation.

14. The method of claim 10, wherein the zone composed of porous material extends from a first surface of the semiconductor wafer right into a depth T measured from the surface of the semiconductor wafer.

15. The method of claim 10, wherein the width B of the at least one zone composed of porous material in the direction from one active region to the closest active region is between 0.5 µm and 100 µm.

* * * * *